US012733450B2

(12) United States Patent
Netzband et al.

(10) Patent No.: US 12,733,450 B2
(45) Date of Patent: Sep. 8, 2026

(54) MULTI-MATERIAL CHUCK

(71) Applicant: Tokyo Electron Limited, Tokyo (JP)

(72) Inventors: Christopher Netzband, Albany, NY (US); Adam Gildea, Albany, NY (US)

(73) Assignee: Tokyo Electron Limited, Tokyo (JP)

( * ) Notice: Subject to any disclaimer, the term of this patent is extended or adjusted under 35 U.S.C. 154(b) by 408 days.

(21) Appl. No.: 18/376,359

(22) Filed: Oct. 3, 2023

(65) Prior Publication Data

US 2025/0112083 A1 Apr. 3, 2025

(51) Int. Cl.

| | |
|---|---|
| ***H10P 72/76*** | (2026.01) |
| ***H10P 10/00*** | (2026.01) |
| ***H10P 72/00*** | (2026.01) |
| ***H10P 72/78*** | (2026.01) |

(52) U.S. Cl.

CPC ........ *H10P 72/7616* (2026.01); *H10P 10/128* (2026.01); *H10P 72/0428* (2026.01); *H10P 72/0604* (2026.01); *H10P 72/78* (2026.01)

(58) Field of Classification Search

CPC ............. H01L 21/68757; H01L 21/187; H01L 21/67092; H01L 21/67253; H01L 21/6838; H01L 21/6875; H10P 72/7616; H10P 10/128; H10P 72/0428; H10P 72/0604; H10P 72/78; H10P 72/7614; H10P 10/1285; H10P 10/12; H10P 90/1914; H10P 90/1916; H10P 10/126; H10P 54/52; H10P 56/00; H10P 90/1918; H10P 90/192; H10P 10/14; H10P 52/00; H10P 58/00

See application file for complete search history.

(56) References Cited

U.S. PATENT DOCUMENTS 6,257,564 B1 * 7/2001 Avneri ................ H01L 21/6875 269/21
2008/0229811 A1 9/2008 Zhao et al.
2011/0198817 A1 * 8/2011 Hurley ................ H10P 72/0428 279/3
2014/0261960 A1 9/2014 Lin et al.
2017/0250101 A1 8/2017 Parkhe et al.
2018/0284071 A1 * 10/2018 Wright ................. G01N 29/223
2018/0370210 A1 * 12/2018 Kim ........................ B32B 37/10
2019/0244848 A1 8/2019 Willwerth et al.
2019/0341289 A1 11/2019 Parkhe (Continued)

FOREIGN PATENT DOCUMENTS

CN 217405391 U 9/2022
EP 3 382 744 A1 10/2018

(Continued)

OTHER PUBLICATIONS

International Search Report and Written Opinion on International Application No. PCT/US2024/038150 dated Oct. 31, 2024 (10 Pages).

*Primary Examiner* — Chad M Dicke
*Assistant Examiner* — Gary Abel
(74) *Attorney, Agent, or Firm* — Foley & Lardner LLP

(57) ABSTRACT

Conformal semiconductor chucks are disclosed. The semiconductor chucks can include a first portion comprising a first vacuum pad. The semiconductor chucks can include a second portion exhibiting greater compliance than either of the first portion or a third portion. The semiconductor chucks can include the third portion comprising a second vacuum pad.

20 Claims, 8 Drawing Sheets

(56) References Cited

U.S. PATENT DOCUMENTS

| | | | | |
|---|---|---|---|---|
| 2021/0356439 | A1* | 11/2021 | Kwon | G01N 29/26 |
| 2022/0172993 | A1* | 6/2022 | Kang | H01L 21/6838 |
| 2023/0091517 | A1* | 3/2023 | Mizuta | H01L 21/67092<br>156/60 |
| 2023/0207369 | A1* | 6/2023 | Lee | H01L 21/68742<br>279/128 |
| 2024/0055290 | A1* | 2/2024 | Wang | H01L 21/67253 |
| 2025/0079228 | A1* | 3/2025 | Tsai | G03F 7/70708 |

FOREIGN PATENT DOCUMENTS

| | | | | |
|---|---|---|---|---|
| EP | 3 886 149 | A1 | 9/2021 | |
| JP | 2020-115593 | A | 7/2020 | |
| WO | WO-2017/162272 | A1 | 9/2017 | |
| WO | WO-2018/028801 | A1 | 2/2018 | |
| WO | WO-2019/057286 | A1 | 3/2019 | |
| WO | WO-2022/002345 | A1 | 1/2022 | |
| WO | WO-2022225705 | A1 * | 10/2022 | H10P 72/78 |
| WO | WO-2024/046577 | A1 | 3/2024 | |
| WO | WO-2024/046578 | A1 | 3/2024 | |

* cited by examiner 114
116
602
604
102
118
502

MULTI-MATERIAL CHUCK

TECHNICAL FIELD

This disclosure relates to semiconductor wafer handling devices. The semiconductor wafer handling devices can interface with semiconductor wafers during bonding or other operations.

BACKGROUND

Fabrication of semiconductor devices can include wafer stacking, bonding, or other handling or operations which can impart stress or cause displacement of the wafers. Such stress or displacement can impact alignment, performance, and yield in semiconductor devices. Improvements in the art are desired.

SUMMARY

In order to continue scaling down semiconductor devices, device structures can be designed to extend in their vertical direction, such as upwards from the substrate on which they are fabricated. Such designs can employ various stacked layers, such as any number of stacked wafers. The stacked wafers can be coupled to one another via van der Waals forces, electrostatic forces, or chemical bonds at a bonding interface. Bonding (e.g., adhesive) materials can mechanically couple wafers, or ohmic connections can be formed between wafers. Wafers can be disposed between wafer chucks (e.g., a top wafer chuck and a bottom wafer chuck) to impart thermal energy, pressure, maintain wafer flatness, or otherwise encourage wafer bonding. The respective chucks can control wafer alignment, temperature, pressure, rotation, alignment, flatness, and so forth. The top chuck can include an opening to receive a striker to cause the top wafer to couple to the lower wafer (e.g., at a wafer center point). The top wafer can deflect towards the lower wafer to couple thereto, and the coupling can thereafter extend radially outward based on the wafer-wafer forces, such as those described above. Thus, a propagation wave (also referred to as a lamination wave) can propagate outward from an initial coupling between the wafers.

In general, the propagation wave can be represented as a lateral wave which propagates incident to a vertical movement of the wafer. However, where the wafer is fixed to a non-conformal surface, the propagation wave can cause a lateral tensile stress of the wafer as the striker causes the wafer to extend a radial lateral dimension to deflect towards another wafer, and a subsequent lateral compressive stress, as the propagation wave moves towards the fixed portion of the wafer. An inclusion of a conformal material along a surface of the chuck can absorb a portion of such stress. That is, a multi-material chuck can include a first material configured to interface with wafer holders such as vacuum pads, and to maintain flatness, rigidity, and so forth. The multi-material chuck can include a second material configured to conform to a wafer so as to aid the lateral displacement of the wafer, so as to avoid stress accumulated therein. For example, carrier mobility, carrier concentration, dislocations in the crystal lattice, and the like may be impacted by such stress, such that the inclusion of the conformal material can improve a performance or yield of semiconductor devices including wafer portions bonded by the multi-material chucks disclosed herein. Further vacuum pads or other wafer holders can couple to the wafer radially beyond the compliant material. The multi-material chuck can interface with a controller to control the release of such wafer holders based on a propagation wave.

One aspect of the present disclosure is directed to a system for fabricating semiconductor devices. The system includes a first portion of a semiconductor chuck comprising a first material along a facing thereof. The system includes a second portion of the semiconductor chuck circumscribed about the first portion along the facing, the second portion configured to exhibit greater compliance than the first material. The system includes a third portion of the semiconductor chuck circumscribed about the first portion along the facing, the third portion configured to exhibit greater compliance than the first material. The system includes a plurality of wafer holders disposed along the facing, the wafer holders configured to selectively couple a to a semiconductor wafer along the facing.

The wafer holders can be or include vacuum pads.

The system can include one or more processors. The processors can be configured to cause a striker to displace a first semiconductor wafer from the facing. The processors can cause an actuation of the wafer holders to decouple from the semiconductor wafer subsequent to the displacement of the first semiconductor wafer at the striker, and prior to an arrival of a lamination wave at the wafer holders.

The system can include a sensor to detect a lamination wave propagation. The actuation of the wafer holders can be responsive to a signal detected by the sensor.

The signal can be based on a vertical distance between the wafer chuck and the first semiconductor wafer.

The system can include a second sensor. The sensor can detect an indication of the propagation wave at a first point along the first semiconductor wafer. The second sensor can detect an indication of the propagation wave at a second point along the first semiconductor wafer. The processor can determine a propagation speed based on an elapsed time between the first indication and the second indication. The actuation of the wafer holders can be based on the propagation speed.

The semiconductor chuck of the system can include a fourth portion of the semiconductor chuck circumscribed about the first portion along the facing, the fourth portion comprising the first material. The semiconductor chuck of the system can include a fifth portion of the semiconductor chuck circumscribed about the sixth portion along the facing, the fifth portion configured to exhibit greater compliance than the first material. The third portion can be circumscribed about the fifth portion.

The semiconductor chuck can include a backing layer along a second facing of the semiconductor chuck, opposite the facing. The backing layer and the second portion of the semiconductor chuck can be monolithic structure extending through the semiconductor chuck along an axis perpendicular to the facing.

The first material can be or include silicon carbide (SiC), silicon dioxide ($SiO_2$), silicon oxynitride ($SiO_XN_Y$), silicon oxy-carbonitride (SiOCN), silicon carbonitride (SiCN), silicon nitride (SiN), alumina ($Al_2O_3$), or aluminum nitride (AlN).

The second portion can be or include polydimethylsiloxane (PDMS), polyether ether ketone (PEEK), polyimide (PI), polyether imide (PEI), polymethylmethacrylate (PMMA), polyamide (PA), polyamide imide (PAI), polybutylene terephthalate (PBTP), or liquid crystal polymers.

Another aspect of the present disclosure is directed to a method. The method includes actuating a plurality of wafer holders to couple a first wafer to a wafer chuck. The method includes instantiating, at an instantiation point, wafer bonding between the first wafer and a second wafer, wherein the first wafer is coupled to a plurality of portions of the wafer chuck. The portions can include a first portion including a first material. The portions can include a second portion circumscribing first portion, the second portion configured to exhibit greater compliance than the first portion. The portions can include a third portion circumscribing the first portion, the third portion comprising the plurality of wafer holders.

The method can include actuating the plurality of wafer holders to decouple an outer portion of the first wafer from the third portion of the wafer chuck. The actuation can be subsequent to the instantiation of the wafer bonding and prior to an arrival of a propagation wave to a point of the wafer laterally aligned with the plurality of wafer holders.

The method can include actuating a second wafer holder of the first portion of the wafer chuck, to decouple an inner portion of the first wafer from the first portion of the wafer chuck, prior to actuating the plurality of wafer holders to decouple the outer portion of the first wafer.

The method can include detecting, via one or more propagation sensors, a position of the propagation wave. The method can include actuating the plurality of wafer holders to decouple the first wafer from the wafer chuck, subsequent to the instantiation of the wafer bonding and prior to an arrival of a propagation wave to a point of the wafer laterally aligned with the plurality of wafer holders.

The position of the propagation wave can include a plurality of positions disposed around a circumference of the chuck. The actuation of the plurality of wafer holders can decouple the first wafer from the wafer chuck; such actuation can include decoupling a first wafer holder of the plurality of wafer holders responsive to a first detection of the propagation wave at a first chordal point. Such actuation can further include decoupling a second wafer holder of the plurality of wafer holders responsive to a second detection of the propagation wave at a second chordal point.

Another aspect of the present disclosure is directed to a wafer chuck. The wafer chuck includes a first portion having a first vacuum pad. The wafer chuck includes a second portion which does not include a vacuum pad, the second portion exhibiting greater compliance than either of the first portion or a third portion. The third portion can include a second vacuum pad.

The first portion, the second portion, and the third portion can be concentric. The second portion can intermediate the first portion from the second portion.

The first portion and the third portion can be respective portions of a monolithic structure.

The wafer chuck can include a fourth portion concentrically intermediating the second portion from a fifth portion. The third portion can be a portion of a same monolithic structure as the first and third portion. The fifth portion can concentrically intermediate the fourth portion from the third portion. The fifth portion can be a portion of a same monolithic structure as the second portion.

The second portion can include a plurality of segments, the segments being mechanically decoupled from each other. These and other aspects and implementations are discussed in detail below. The foregoing information and the following detailed description include illustrative examples of various aspects and implementations and provide an overview or framework for understanding the nature and character of the claimed aspects and implementations. The drawings provide illustrations and a further understanding of the various aspects and implementations and are incorporated in and constitute a part of this specification. Aspects can be combined, and it will be readily appreciated that features described in the context of one aspect of the invention can be combined with other aspects. Aspects can be implemented in any convenient form. As used in the specification and in the claims, the singular form of "a," "an," and "the" include plural referents unless the context clearly dictates otherwise.

BRIEF DESCRIPTION OF THE DRAWINGS

Non-limiting embodiments of the present disclosure are described by way of example with reference to the accompanying figures, which are schematic and are not intended to be drawn to scale. Indeed, various features of the figures may be intentionally emphasized to depict various features thereof. Unless indicated as representing the background art, the figures represent aspects of the disclosure. For purposes of clarity, not every component may be labeled in every drawing. In the drawings.

DETAILED DESCRIPTION

Figure 1:
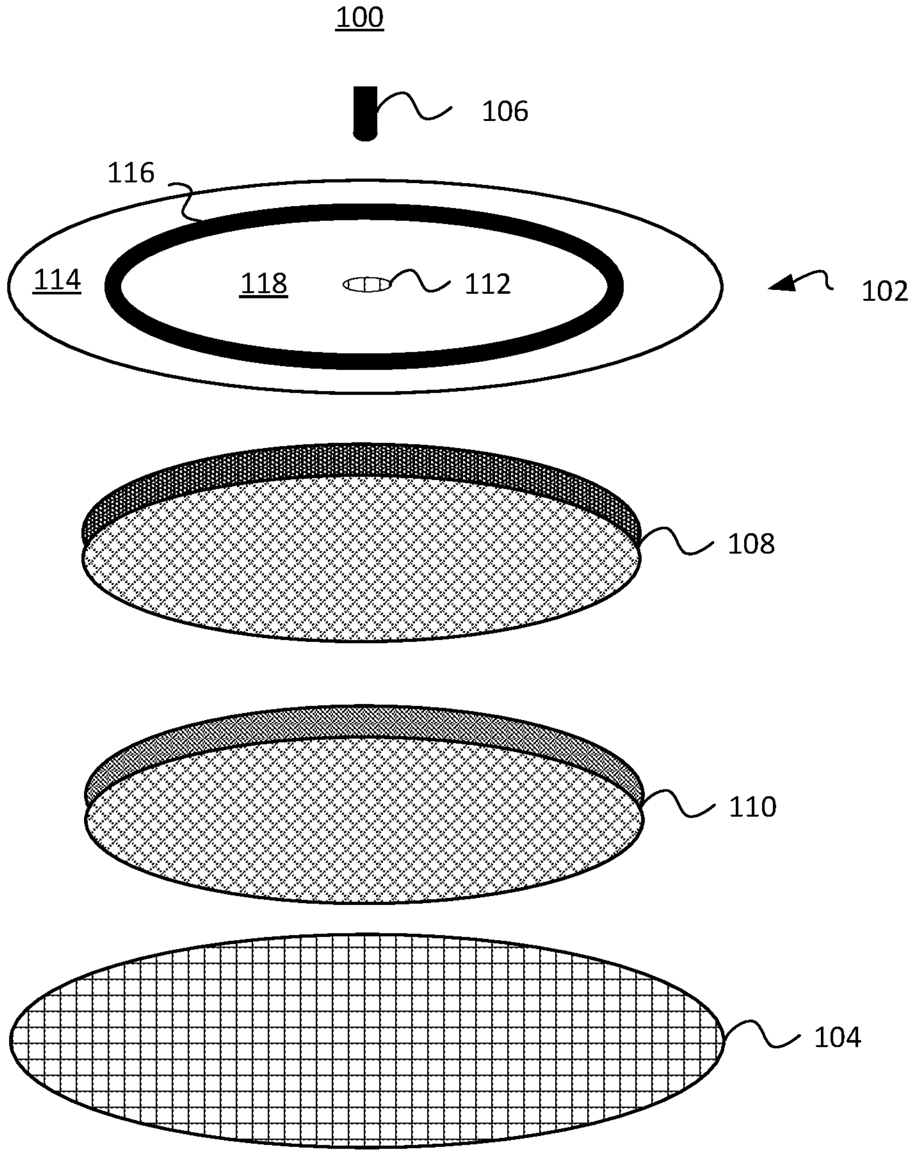
FIG. 1 illustrates an exploded diagram of a system for wafer bonding, in accordance with some embodiments.

Reference will now be made to the illustrative embodiments depicted in the drawings, and specific language will be used here to describe the same. It will nevertheless be understood that no limitation of the scope of the claims or this disclosure is thereby intended. Alterations and further modifications of the inventive features illustrated herein, and additional applications of the principles of the subject matter illustrated herein, which would occur to one skilled in the relevant art and having possession of this disclosure, are to be considered within the scope of the subject matter disclosed herein. Other embodiments may be used and/or other changes may be made without departing from the spirit or scope of the present disclosure. The illustrative embodiments described in the detailed description are not meant to be limiting of the subject matter presented.

Likewise, although the Figures and aspects of the disclosure may show or describe devices herein as having a particular shape, it should be understood that such shapes are merely illustrative and should not be considered limiting to the scope of the techniques described herein. Although certain figures show various elements and operations related to wafer bonding systems to reduce a stress of a semiconductor wafer, other elements and operations are contemplated, and indeed, the techniques described herein may be implemented to achieve various stress profiles. Moreover, although references herein are made to “top,” “bottom,” “vertical,” “lateral” and the like, such descriptions are intended to describe one or more depicted embodiments, and not intended to provide limiting effect. For example, in some embodiments, the top chuck and bottom chuck, or individual features thereof, may be inverted, rotated, skewed, or so forth.

FIG. 1 illustrates an exploded diagram of a system 100 for wafer bonding, in accordance with some embodiments. The system 100 includes a top chuck 102 configured to interface with a bottom chuck 104. The top chuck 102 and bottom chuck 104 can perform various operations, such as temporary or permanent bonding of wafers such as the depicted top wafer 108 and bottom wafer 110. Thus, the top chuck 102 and bottom chuck 104 may be referred to as wafer chucks, semiconductor chucks, and the like, without limiting effect. According to various embodiments, the top wafer 108 and bottom wafer 110 can include semiconductor wafers at various stages of fabrication. For example, either wafer can include a silicon, silicon-germanium, or other intrinsic semiconductor wafer, a wafer with various circuits formed along an active surface thereof, a wafer with various metallization layers formed over such active circuits, etc.

The top chuck 102 can be operatively coupled with a striker 106 to couple a top wafer 108 to a bottom wafer 110, the top wafer 108 being operatively coupled to the top chuck 102 and the bottom wafer 110 being operatively coupled to the bottom chuck 104. According to various embodiments, the striker 106 can be replaced by various wafer coupling mechanisms, such as a thermal element or a lateral surface of the top chuck 102 or bottom chuck 104 configured to cause a coupling at a predefined point, such as a center of the wafers 108, 110 (e.g., can include a slight convexity to a surface).

Figure 3:
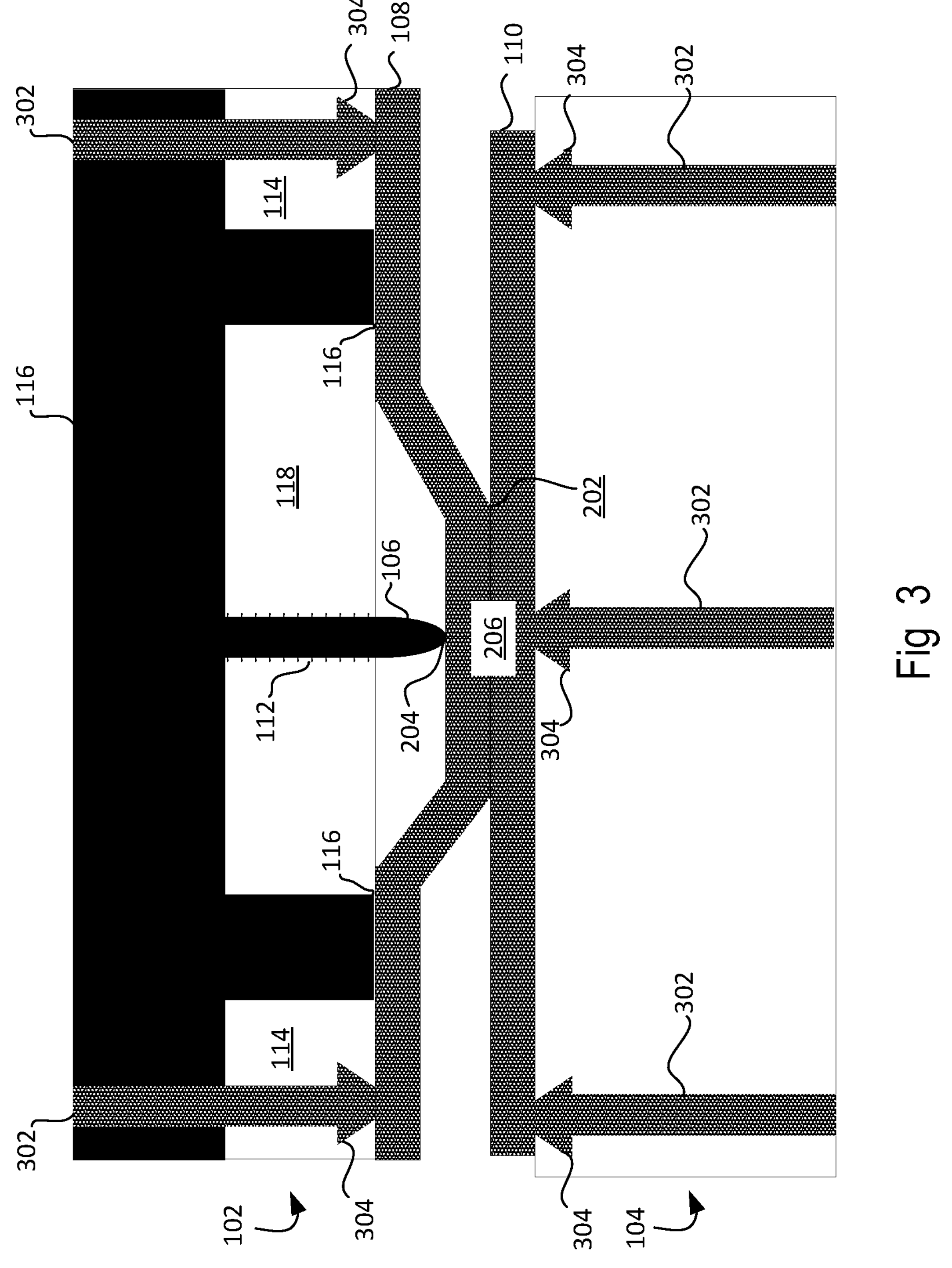
FIG. 3 illustrates a cross sectional view of the propagation wave of FIG. 2, in accordance with some embodiments.

The top chuck 102 can include an outer portion 114 which includes a wafer holder such as an electro-static, mechanical, or vacuum-based holder, such as the vacuum pads 304 of FIG. 3. The outer portion 114 can circumscribe an inner portion 118 which can include further wafer holders (not depicted) of a same or different type as the outer portion 114. Any of the wafer holders described herein can be selectively engaged. For example, wafer holders of the inner portion 118 can be disengaged to aid the displacement of the top wafer 108, outwards towards the bottom wafer 110 upon a receipt, through an opening 112 of the top chuck 102, of the striker 106.

A conformal portion 116 of the wafer chuck can intermediate the inner portion 118 from the outer portion 114. The conformal portion 116 can interface with the top wafer 108 and can deform with the top wafer 108 to reduce an amount of accumulated stress therein. For example, during bonding operations, the conformal portion 116 can deform, absorbing energy to reduce an accumulation of stress within the top wafer 108 to reduce or eliminate a compressive force incident to a propagation wave between the top wafer 108 and the bottom wafer 110. The inner portion 118, conformal portion 116, and outer portion 114 can include various materials. For example, in some embodiments, the inner portion 118 or outer portion 114 can be or include silicon carbide (SiC), silicon dioxide ($SiO_2$), silicon oxynitride ($SiO_xN_y$), silicon oxy-carbonitride (SiOCN), silicon carbonitride (SiCN), silicon nitride (SiN), alumina ($Al_2O_3$), or aluminum nitride (AlN). The conformal portion 116 can be or include polydimethylsiloxane (PDMS), polyether ether ketone (PEEK), polyimide (PI), polyether imide (PEI), polymethylmethacrylate (PMMA), polyamide (PA), polyamide imide (PAI), polybutylene terephthalate (PBTP), or liquid crystal polymers. The liquid crystal polymers can include additives such as such as glass or carbon fibers, to modulate the compliance thereof.

Figure 2:
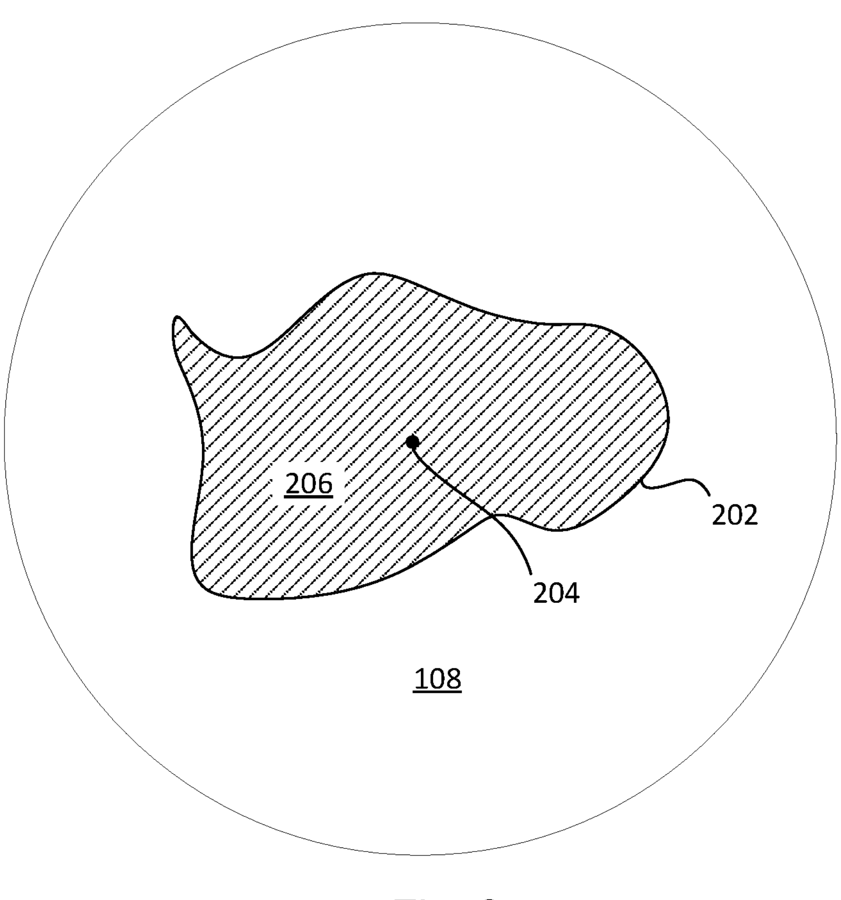
FIG. 2 illustrates a top view of a propagation wave generated by the system of FIG. 1, in accordance with some embodiments.

FIG. 2 illustrates a top view of a propagation wave 202 generated by the system 100 of FIG. 1, in accordance with some embodiments. The propagation wave 202 refers to a lateral boundary of an interface between the top wafer 108 and bottom wafer 110 (not depicted). For example, upon the striker 106 deflecting the top wafer 108 towards the bottom wafer 110, the top wafer 108 can couple to the bottom wafer 110 at an instantiation point 204 thereof (e.g., a center of the wafers 108, 110 where the striker 106 is centrally located relative to the wafers 108, 110). The lateral location at the center of the top wafer 108 and bottom wafer 110 or other location which initiates the inter-wafer lamination (e.g., corresponding to the striker 106) may be referred to as an instantiation point. The propagation wave 202 can extend generally radially outward, such that the propagation wave 202 defines a lateral boundary a coupled portion 206 of the top wafer 108 and bottom wafer 110, and a portion of each of the top wafer 108 and bottom wafer 110 which are not coupled. The propagation wave 202 may also be referred to as a lamination wave, where the propagation refers to a lamination formed from the combination of the top wafer 108 and bottom wafer 110.

In some embodiments, the propagation wave 202 can propagate at a substantially same rate in each direction, such that the propagation wave 202 can be substantially concentric to the outer edge of the circular wafers 108, 110. In some embodiments, as depicted, the propagation wave 202 may propagate at different rates in different lateral directions based on non-uniform pressure or temperature variations, thickness variations, or so forth. That is, the propagation wave 202 can travel at different effective speeds towards the outer edge of the, for example, top wafer 108. Where a radial extremity of the top wafer 108 is coupled, via a wafer holder such as a vacuum pad 304, to the outer portion 114 of the top chuck 102 (not depicted), the propagation wave 202 may arrive at each of the segments of the outer portion 114 at a different time. Thus, as is described herein, each wafer holder or various combinations thereof can be operated responsive to a detection of the propagation wave 202. Further, the inclusion of a conformal portion of a wafer holder can deform along with a top wafer 108, or absorb energy associated with the propagation wave 202 from the wafers 108, 110 as is further described herein.

FIG. 3 illustrates a cross sectional view of the propagation wave 202 of FIG. 2, in accordance with some embodiments. Further included in the view are the top chuck 102 and the bottom chuck 104 vertically bounding the top wafer 108 and bottom wafer 110. The bottom chuck 104 is coupled to the bottom wafer 110 by various vacuum pads 304 coupled to vacuum lines 302 extending through the bottom chuck 104. The various vacuum lines 302 may be individually actuated, or collectively controlled (e.g., so that all or a portion of lines are engaged together). The vacuum pads 304 are shown at lateral extremes of the bottom chuck 104, vertically corresponding to the segments of the outer portion 114 of the top chuck 102, as well as to portions of the bottom chuck 104 vertically corresponding to the inner portion 118 of the top chuck 102. Although not depicted, for clarity, the inner portion 118 of the top chuck 102 can include vacuum pads 304. Further, in various embodiments, various other wafer holders can be substituted for any of the vacuum pads 304 described with regard to the various illustrative examples herein.

The striker 106 is shown in an engaged state, extending through the opening 112 of the top chuck 102 causing the downward deflection of the top wafer 108 to couple to the bottom wafer 110. The deflection extends a lateral dimension of the top wafer 108 according to a stress-strain relationship of the wafer. That is, absent a conformal displacement of the conformal portion 116, the portion of the top wafer 108 adhered to the top chuck 102 and the portion of the top wafer 108 extending from the top chuck 102 to the propagation wave 202 may be laterally compressed towards the fixed location of the vacuum pad 304. Consequently, accumulated stress or misalignment of features between the top wafer 108 and bottom wafer 110 may impact a performance, reliability, or yield of various semiconductor devices. By inclusion of the conformal portion 116, such compression or accumulation of compressive stresses may be reduced or eliminated. For example, the conformal material can expand radially outward upon an arrival of the propagation wave 202, so as to reduce the amount of stress accumulated in the top wafer 108.

The depicted figure can exclude some portions of the top chuck 102 or various elements interfacing therewith. Further, some portions may not be depicted in the figure. For example, the figure excludes one or more interconnections between the various vacuum lines 302 or an operative connection between the vacuum lines 302 and any valve, regulator, pump, or the like. Further, sensors configured to detect a speed or position of the propagation wave 202, can be disposed along a face of the top chuck 102. Any of such components, or further components still, may be connected to one or more processors, coupled to memory, configured to actuate, monitor, or otherwise control the various components. For example, the processor (which may also be referred to as a controller, without limiting effect), can be or include the processor 810 of FIG. 8.

Figure 4:
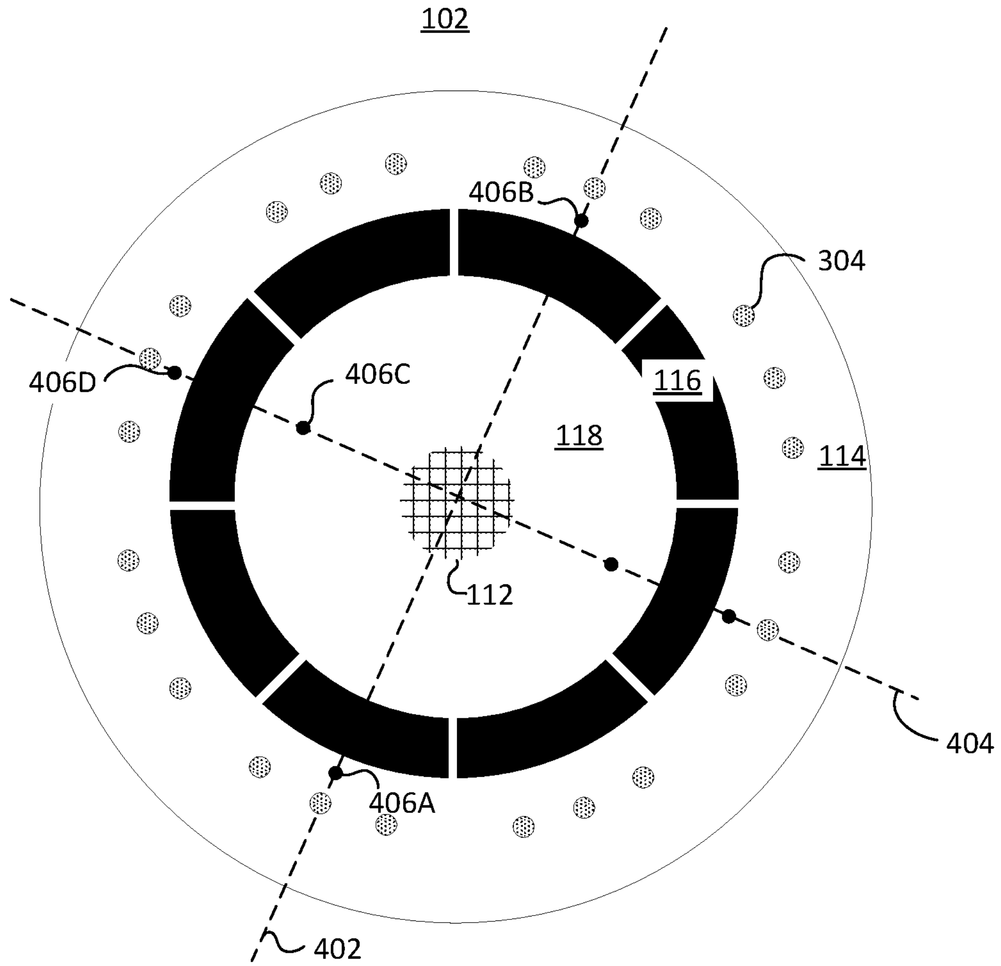
FIG. 4 illustrates a top view of a facing of a semiconductor chuck, in accordance with some embodiments.

FIG. 4 illustrates a top view of a facing of a semiconductor chuck, in accordance with some embodiments. For example, the chuck can be a top chuck 102, wherein the facing is configured to interface with a top wafer 108. The outer portion 114 includes various vacuum pads 304. The conformal portion 116 is shown disposed along various radial axes of the top chuck 102. Any number of further segments may be present in various embodiments. The segmentation of the conformal portion 116 can reduce a mechanical coupling between the various segments such that different segments of the conformal portion 116 can displace in different directions or at different times, relative to a continuous conformal portion 116, wherein intra-conformal portion forces can limit a displacement in one or more directions. For example, where a propagation wave 202 interfaces with the conformal portion 116 at a first location, a nearby location of the conformal portion 116 can, due to adhesive forces within the conformal portion 116, cause a deformation of the wafer prior to an arrival of the propagation wave 202. Conversely, where a propagation wave 202 radiates outward generally concentrically, the segmentation of the conformal portion 116 may operate more similarly to a continuous conformal portion 116, according to some embodiments. The segments of the conformal portion 116, collectively, can be referred to as circumscribing the inner portion 118. Likewise, the outer portion 114 circumscribes the inner portion 118 and the conformal portion 116. Such circumscription may include gaps such as the depicted gaps between the segments of the conformal portion 116, or the conformal portion 116 can include various other geometries.

In various embodiments the outer portion 114, various segments of the conformal portion 116, along with the inner portion 118, can include various sizes, shapes, numbers, etc. of vacuum pads 304. In some embodiments, the conformal portion 116 can omit such vacuum pads 304. Various embodiments of vacuum pads 304 can include circular, curvilinear, rectangular, or other shaped pads. Each vacuum pad 304 may operatively connect to a vacuum line 302 connecting to further vacuum pads 304, such that the vacuum pad 304 is operatively connected to the further vacuum pads 304. Any of the various vacuum pads 304 can be coupled to a controller such as the processor 810 of FIG. 8. The controller can cause the release of the vacuum of the vacuum pad 304 based on a time of a striker 106 engagement or other initiation of a propagation wave 202 or based on a detection of the propagation wave 202, or an indication thereof, such as a vertical distance between a chuck and a wafer, a doppler signal return, or a magnetic measurement.

The propagation wave 202 can be detected by various sensors 406 such as a distance sensor 406 (e.g., laser, ultrasonic, etc.) to detect a position of the top wafer 108 relative to the top chuck 102. The propagation sensors 406 can be disposed in the inner portion 118 or outer portion 114 along one or more radial axes of the top chuck 102. For example, a first pair of sensors 406A, 406B of the outer portion 114 are disposed along opposite ends of a first radial axis 402 radially inward of the vacuum pads 304. Another pair of sensors 406C, 406D are disposed at various radial distances along a second radial axis 404, which is perpendicular to the first radial axis 402 along a same lateral plane along a facing of the top chuck 102.

A propagation sensor 406 can detect a position of a propagation wave 202. The controller can determine a speed of the propagation wave 202, based on an elapsed time relative to an engagement of a striker 106 or a detection of the propagation wave 202 at another propagation sensor 406. By positioning various propagation sensors 406 around various axes of the top chuck 102, a propagation wave 202 may be characterized (with regard to various vacuum pads 304). For example, separate propagation sensors 406 can be disposed over an axis for each vacuum pads 304 or grouping thereof, or the processor can interpolate a position of the propagation wave 202.

Figure 5:
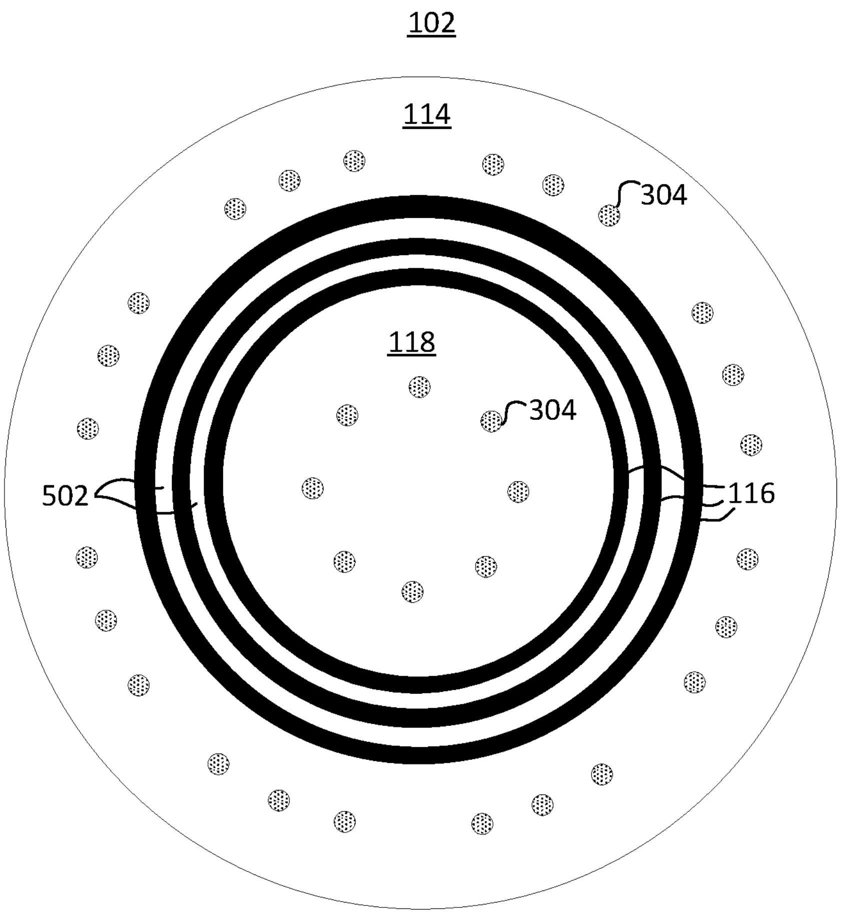
FIG. 5 illustrates another top view of a facing of a semiconductor chuck, in accordance with some embodiments.

FIG. 5 illustrates another top view of a facing of a semiconductor chuck, in accordance with some embodiments. For example, the semiconductor chuck can be another top chuck 102, which may illustrate various elements which can be added, modified, omitted, or so forth, according to various embodiments of the present disclosure. That is, FIG. 5 depicts some features not depicted in FIG. 4, merely to more clearly disclose those features; various further embodiments can be embodied by combinations of the features depicted by FIG. 4 or FIG. 5, various other features described herein, variants of, and the like. For example, the opening 112 may be omitted, or a wafer holder may be disposed at a center of the top semiconductor chuck 102.

As depicted, the inner portion 118 can include further vacuum pads 304. Additionally, the depicted top semiconductor chuck 102 includes multiple conformal portions 116 concentric to each other. That is, the various conformal portions may be intermediated by various intermediate portions 502 which exhibit lesser compliance than the conformal portions 116. For example, the intermediate portions 502 can be or include a same material of the inner portion 118 and outer portion 114. In some embodiments, the intermediate portions 502, or the inner portion 118 and outer portion 114 can be coupled together to form an integral body. That is, the inner portion 118 and outer portion 114, along with any intermediate portions 502 present in some embodiments, may be constituent components of a monolithic structure. Such embodiments may offer improved flatness, rigidity, force distribution, and the like, relative to some other implementations. Likewise, the conformal portion(s) 116 can be a monolithic structure (e.g., connected at a backing layer at an opposite face of the top semiconductor chuck 102), or can be separate portions impregnating the monolithic structure of the inner portion 118 and outer portion 114.

Figure 6:
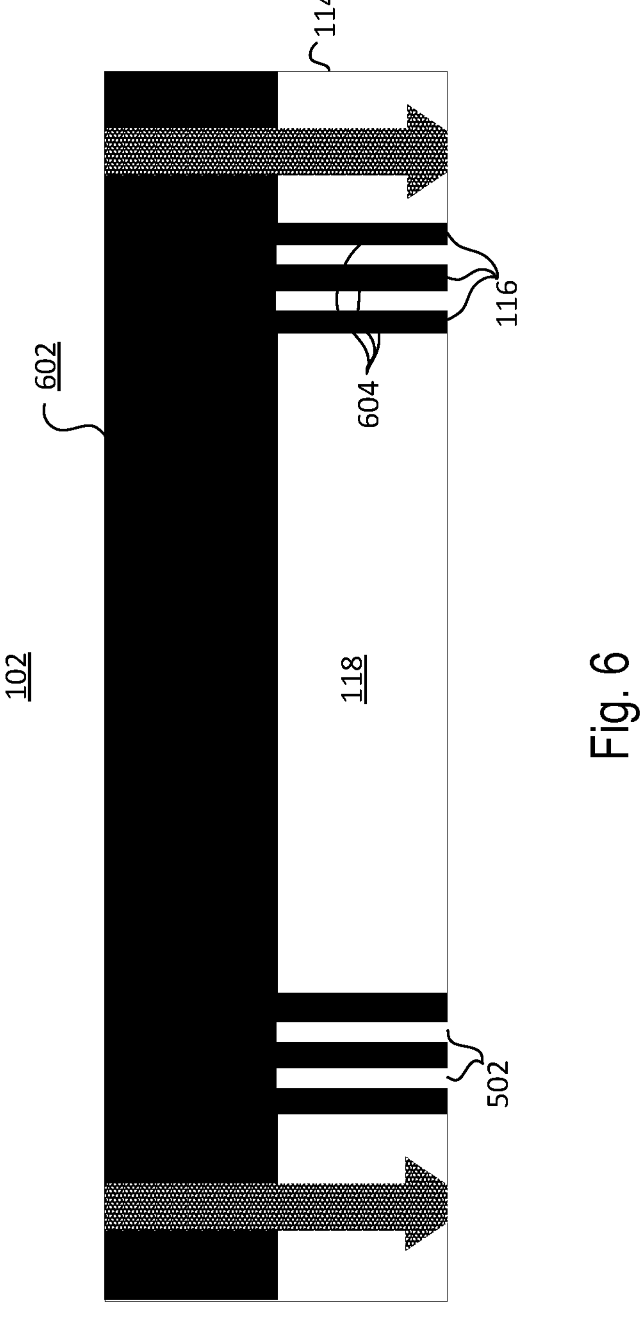
FIG. 6 illustrates a cross sectional view of a semiconductor chuck, in accordance with some embodiments.

FIG. 6 illustrates a cross sectional view of a semiconductor chuck, in accordance with some embodiments. For example, FIG. 6 can depict a cross sectional view of a top semiconductor chuck 102 of FIG. 5. As depicted, a backing layer 602 connects to the conformal portion 116 along the face of the top semiconductor chuck 102, via various bridging connectors 604 coupling the opposite faces of the semiconductor chuck. The bridging connectors 604 can be discontinuous around an arc of the semiconductor chuck such that the inner portion 118, outer portion 114, and any intermediate portions 502 may comprise a monolithic structure. According to various embodiments, the conformal portion 116 of the semiconductor chuck can be flush with, or somewhat protruding beyond a lateral plane of the face of the inner portion 118 and outer portion 114 of the top semiconductor chuck 102 (e.g., the facing depicted in FIG. 4 and FIG. 5).

Figure 7:
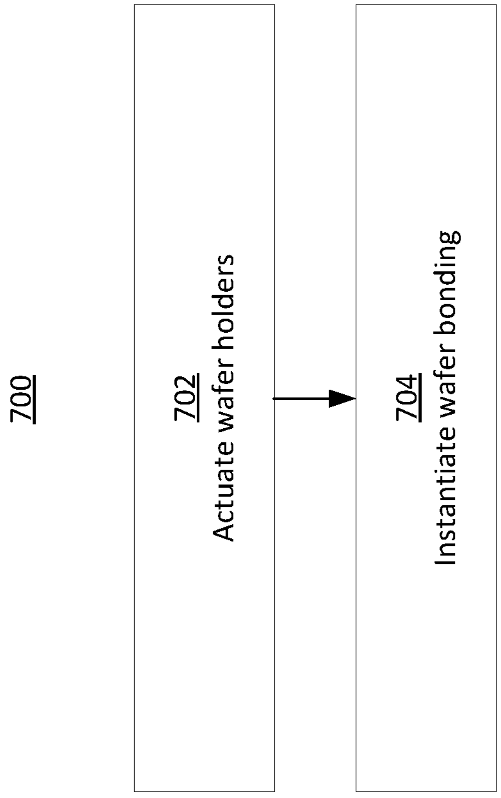
FIG. 7 illustrates a method of wafer bonding, in accordance with some embodiments.

FIG. 7 illustrates a method 700 of wafer bonding, in accordance with some embodiments. In brief summary, the method 700 includes an actuation of wafer holders at operation 702, and an instantiation of wafer bonding at operation 704. It is noted that the method 700 is merely an example and is not intended to limit the present disclosure. Accordingly, it is understood that additional operations may be provided before, during, and after the method 700 of FIG. 7. Some operations may only be briefly described herein or may be omitted. For example, in some embodiments, the various wafer holders may be actuated responsive to a detection of a propagation wave 202 incident to the instantiation of wafer bonding, or the wafer holders can be actuated to decouple from the wafer, based on the detection of the propagation wave 202, or an elapsed time from the instantiation of the wafer bonding.

Referring again to operation 702, wafer holder is actuated to couple a first wafer to a wafer chuck. For example, the first wafer chuck can be a top wafer chuck 102, and the wafer can be a top wafer 108 configured to bond with a bottom wafer 110 coupled to a bottom wafer chuck 104. The actuation can include a processor causing one or more valves, pumps, or the like to interface with a vacuum pad 304 to couple the wafer 108 to the chuck 102. The coupling can be configured to prevent a horizontal or vertical displacement of the wafer or can permit some lateral forces to displace the wafer 108. That is, the coupling can be fixed or slidable.

Referring again to operation 704, wafer bonding is instantiated. The instantiation can be by an operation of a striker 106, or a pressure, temperate or the like exercised by the top wafer chuck 102 or bottom wafer chuck 104 with respect to the top wafer 108 and bottom wafer 110. The instantiation can begin at a portion of the respective wafers 108, 110 laterally aligned with a first, inner portion 118 of the top wafer chuck 102, which is or includes a first material which is generally non-conformal (e.g., less conformal than the second portion). A second portion can intermediate the first portion, such that the second portion can conform to a propagation wave 202 radiating outward therefrom. In some embodiments, the propagation wave 202 can propagate over further concentric portions, such as further portions of or including the first material, and intermediating conformal portions 116. The propagation wave 202 can interact with the conformal portions 116 (e.g., impart stress thereupon to cause a displacement thereof). The energy imparted to the conformal material can reduce a residual stress of the bonded wafer assembly formed according to the method 700.

Figure 8:
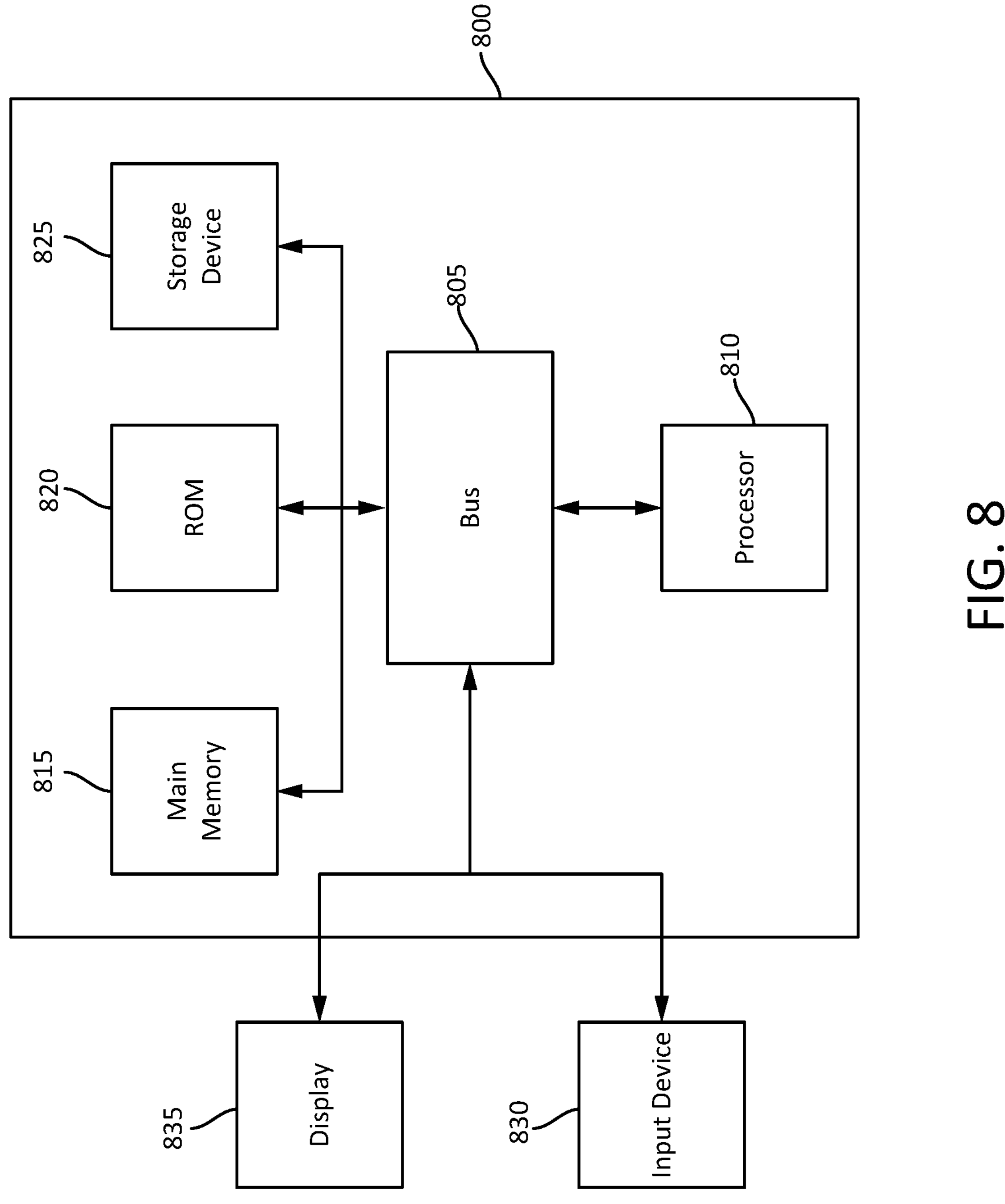
FIG. 8 illustrates a block diagram illustrating an architecture for a computer system that can be employed to implement elements of the systems and methods described and illustrated herein.

FIG. 8 illustrates a block diagram illustrating an architecture for a computer system that can be employed to implement elements of the systems and methods described and illustrated herein. The computer system or computing device 800 can include or be used to implement a controller or its components, and components thereof, which can interface with a top chuck 102 or other component of the systems 100 and methods described herein. The computing system 800 includes at least one bus 805 or other communication component for communicating information and at least one processor 810 or processing circuit coupled to the bus 805 for processing information. The computing system 800 can also include one or more processors 810 or processing circuits coupled to the bus for processing information. The computing system 800 also includes at least one main memory 815, such as a random access memory (RAM) or other dynamic storage device, coupled to the bus 805 for storing information, and instructions to be executed by the processor 810. The main memory 815 can be used for storing information during execution of instructions by the processor 810. The computing system 800 may further include at least one read only memory (ROM) 820 or other static storage device coupled to the bus 805 for storing static information and instructions for the processor 810. A storage device 825, such as a solid state device, magnetic disk or optical disk, can be coupled to the bus 805 to persistently store information and instructions.

The computing system 800 may be coupled via the bus 805 to a display 835, such as a liquid crystal display, or active matrix display. An input device 830, such as a keyboard or mouse may be coupled to the bus 805 for communicating information and commands to the processor 810. The input device 830 can include a touch screen display 835.

The processes, systems and methods described herein can be implemented by the computing system 800 in response to the processor 810 executing an arrangement of instructions contained in main memory 815. Such instructions can be read into main memory 815 from another computer-readable medium, such as the storage device 825. Execution of the arrangement of instructions contained in main memory 815 causes the computing system 800 to perform the illustrative processes described herein. One or more processors in a multi-processing arrangement may also be employed to execute the instructions contained in main memory 815. Hard-wired circuitry can be used in place of, or in combination with, software instructions together with the systems and methods described herein. Systems and methods described herein are not limited to any specific combination of hardware circuitry and software.

Although an example computing system has been described in FIG. 8, the subject matter including the operations described in this specification can be implemented in other types of digital electronic circuitry, or in computer software, firmware, or hardware, including the structures disclosed in this specification and their structural equivalents, or in combinations of one or more of them.

In the preceding description, specific details have been set forth, such as a particular geometry of a processing system and descriptions of various components and processes used therein. It should be understood, however, that techniques herein may be practiced in other embodiments that depart from these specific details, and that such details are for purposes of explanation and not limitation. Embodiments disclosed herein have been described with reference to the accompanying drawings. Similarly, for purposes of explanation, specific numbers, materials, and configurations have been set forth in order to provide a thorough understanding. Nevertheless, embodiments may be practiced without such specific details. Components having substantially the same functional constructions are denoted by like reference characters, and thus any redundant descriptions may be omitted.

Various techniques have been described as multiple discrete operations to assist in understanding the various embodiments. The order of description should not be construed as to imply that these operations are necessarily order dependent. Indeed, these operations need not be performed in the order of presentation. Operations described may be performed in a different order than the described embodiment. Various additional operations may be performed and/or described operations may be omitted in additional embodiments.

"Substrate" or "target substrate" as used herein generically refers to an object being processed in accordance with the invention. The substrate may include any material portion or structure of a device, particularly a semiconductor or other electronics device, and may, for example, be a base substrate structure, such as a semiconductor wafer, reticle, or a layer on or overlying a base substrate structure such as a thin film. Thus, substrate is not limited to any particular base structure, underlying layer or overlying layer, patterned or un-patterned, but rather, is contemplated to include any such layer or base structure, and any combination of layers and/or base structures. The description may reference particular types of substrates, but this is for illustrative purposes only.

References to "or" may be construed as inclusive so that any terms described using "or" may indicate any of a single, more than one, and all of the described terms. References to at least one of a conjunctive list of terms may be construed as an inclusive OR to indicate any of a single, more than one, and all of the described terms. For example, a reference to "at least one of 'A' and 'B'" can include only 'A', only 'B', as well as both 'A' and 'B'. Such references used in conjunction with "comprising" or other open terminology can include additional items.

Those skilled in the art will also understand that there can be many variations made to the operations of the techniques explained above while still achieving the same objectives of the invention. Such variations are intended to be covered by the scope of this disclosure. As such, the foregoing descriptions of embodiments of the invention are not intended to be limiting. Rather, any limitations to embodiments of the invention are presented in the following claims.

What is claimed is:

1. A system for fabricating semiconductor devices, comprising:

a first portion of a semiconductor chuck comprising a first material along a facing thereof;

a second portion of the semiconductor chuck circumscribed about the first portion along the facing, the second portion configured to exhibit greater compliance than the first material, wherein a second material of the second portion extends, from the facing, into the semiconductor chuck;

a third portion of the semiconductor chuck circumscribed about the first portion along the facing, the third portion configured to exhibit greater compliance than the first material; and a plurality of wafer holders disposed along the facing, the wafer holders configured to selectively couple a to a semiconductor wafer along the facing.

2. The system of claim 1, wherein the wafer holders comprise vacuum pads.

3. The system of claim 1, further comprising one or more processors to configured to:

cause a striker to displace a first semiconductor wafer from the facing; and cause an actuation of the wafer holders to decouple from the semiconductor wafer subsequent to the displacement of the first semiconductor wafer at the striker, and prior to an arrival of a propagation wave at the wafer holders.

4. The system of claim 3, wherein the system further comprises:

a sensor to detect the propagation wave, wherein the actuation of the wafer holders is responsive to a signal detected by the sensor.

5. The system of claim 4, wherein the signal is based on a vertical distance between the semiconductor chuck and the first semiconductor wafer.

6. The system of claim 4, further comprising a second sensor, wherein:

the sensor is configured to detect a first indication of the propagation wave at a first point along the first semiconductor wafer;

the second sensor is configured to detect a second indication of the propagation wave at a second point along the first semiconductor wafer; and the one or more processors are configured to determine a propagation speed, based on an elapsed time between the first indication and the second indication, the actuation of the wafer holders being based on the propagation speed.

7. The system of claim 1, wherein the semiconductor chuck further comprises:

a fourth portion of the semiconductor chuck circumscribed about the second portion along the facing, the fourth portion comprising the first material; and a fifth portion of the semiconductor chuck circumscribed about the fourth portion along the facing, the fifth portion configured to exhibit greater compliance than the first material, wherein the third portion is circumscribed about the fifth portion.

8. The system of claim 1, wherein the semiconductor chuck further comprises:

a backing layer along a second facing of the semiconductor chuck, opposite the facing, the backing layer and the second portion of the semiconductor chuck comprise a monolithic structure extending through the semiconductor chuck along an axis perpendicular to the facing.

9. The system of claim 1, wherein the first material compromises silicon carbide (SiC), silicon dioxide ($SiO_2$), silicon oxynitride ($SiO_XN_Y$), silicon oxy-carbonitride (SiOCN), silicon carbonitride (SiCN), silicon nitride (SiN), alumina ($Al_2O_3$), or aluminum nitride (AlN).

10. The system of claim 1, wherein the second portion compromises polydimethylsiloxane (PDMS), polyether ether ketone (PEEK), polyimide (PI), polyether imide (PEI), polymethylmethacrylate (PMMA), polyamide (PA), polyamide imide (PAI), polybutylene terephthalate (PBTP), or liquid crystal polymers.

11. A method, comprising:

actuating a plurality of wafer holders to couple a first wafer to a wafer chuck; and instantiating, at an instantiation point, wafer bonding between the first wafer and a second wafer, wherein the first wafer is coupled to a plurality of portions of the wafer chuck, the plurality of portions comprising:

a first portion comprising a first material;

a second portion circumscribing first portion, the second portion configured to exhibit greater compliance than the first portion, wherein a second material of the second portion extends, from a facing of the wafer chuck, into the wafer chuck; and a third portion circumscribing the first portion, the third portion comprising the plurality of wafer holders.

12. The method of claim 11, further comprising:

actuating the plurality of wafer holders to decouple an outer portion of the first wafer from the third portion of the wafer chuck, subsequent to the instantiation of the wafer bonding and prior to an arrival of a propagation wave to a point of the wafer laterally aligned with the plurality of wafer holders.

13. The method of claim 12, further comprising;

actuating a second wafer holder of the first portion of the wafer chuck, to decouple an inner portion of the first wafer from the first portion of the wafer chuck, prior to actuating the plurality of wafer holders to decouple the outer portion of the first wafer.

14. The method of claim 11, further comprising:

detecting, via one or more propagation sensors, a position of a propagation wave; and actuating the plurality of wafer holders to decouple the first wafer from the wafer chuck, subsequent to the instantiation of the wafer bonding and prior to an arrival of the propagation wave to a point of the wafer laterally aligned with the plurality of wafer holders.

15. The method of claim 14, wherein the position of the propagation wave comprises a plurality of positions disposed around a circumference of the wafer chuck; and the actuation of the plurality of wafer holders to decouple the first wafer from the wafer chuck comprises:

decoupling a first wafer holder of the plurality of wafer holders responsive to a first detection of the propagation wave at a first chordal point; and decoupling a second wafer holder of the plurality of wafer holders responsive to a second detection of the propagation wave at a second chordal point.

16. A wafer chuck comprising:

a first portion comprising a first vacuum pad;

a second portion which does not comprise a vacuum pad, the second portion exhibiting greater compliance than either of the first portion or a third portion, wherein the second portion extends, from a facing including the first vacuum pad, into the wafer chuck; and the third portion comprising a second vacuum pad.

17. The wafer chuck of claim 16, wherein:

the first portion, the second portion, and the third portion are concentric; and the second portion intermediates the first portion from the second portion.

18. The wafer chuck of claim 16, wherein the first portion and the third portion are respective portions of a same monolithic structure.

19. The wafer chuck of claim 16, further comprising:

a fourth portion concentrically intermediating the second portion from a fifth portion, the third portion being a portion of a same monolithic structure as the first portion and the third portion; and the fifth portion concentrically intermediating the fourth portion from the third portion, the fifth portion being a portion of a same monolithic structure as the second portion.

20. The wafer chuck of claim 16, wherein the second portion comprises a plurality of segments mechanically decoupled from each other along a facing of the wafer chuck.

* * * * *